(12) United States Patent
Rubin et al.

(10) Patent No.: US 7,991,368 B2
(45) Date of Patent: Aug. 2, 2011

(54) INTEGRATED RF-IF CONVERTER

(75) Inventors: Zeev Rubin, Alphel Menashe (IL); Amir Eliaz, Moshav Ben-Shemen (IL)

(73) Assignee: Provigent Ltd, Herzliya (IL)

( * ) Notice: Subject to any disclaimer, the term of this patent is extended or adjusted under 35 U.S.C. 154(b) by 886 days.

(21) Appl. No.: 12/005,574

(22) Filed: Dec. 27, 2007

(65) Prior Publication Data

US 2009/0170452 A1   Jul. 2, 2009

(51) Int. Cl.
*H04B 1/04* (2006.01)
(52) U.S. Cl. ........... 455/118; 455/86; 455/296; 455/317
(58) Field of Classification Search .................... 455/73, 455/76, 550.1, 552.1, 91, 296, 320, 84, 86, 455/112, 118, 317, 318, 319, 323
See application file for complete search history.

(56) References Cited

U.S. PATENT DOCUMENTS

| | | | |
|---|---|---|---|
| 4,031,469 A | 6/1977 | Johnson | |
| 4,302,842 A | 11/1981 | Huriau | |
| 6,002,375 A | 12/1999 | Corman et al. | |
| 6,006,069 A | 12/1999 | Langston | |
| 6,418,301 B1 | 7/2002 | Le et al. | |
| 6,701,264 B2 | 3/2004 | Caso et al. | |
| 6,844,787 B2 | 1/2005 | Vann et al. | |
| 6,882,830 B2 | 4/2005 | Higuchi | |
| 6,965,633 B2 | 11/2005 | Sun et al. | |
| 7,031,748 B2 | 4/2006 | Takagi | |
| 7,176,589 B2 | 2/2007 | Rouquette | |
| 7,555,263 B1* | 6/2009 | Rofougaran et al. ......... 455/323 |
| 2002/0168952 A1 | 11/2002 | Vishakhadatta et al. | |
| 2003/0157915 A1 | 8/2003 | Atkinson et al. | |
| 2004/0071165 A1 | 4/2004 | Redfern et al. | |
| 2004/0072547 A1 | 4/2004 | Axness et al. | |
| 2004/0136317 A1 | 7/2004 | Mohan | |
| 2004/0141469 A1 | 7/2004 | Jung et al. | |
| 2004/0166799 A1 | 8/2004 | Kral | |
| 2005/0124307 A1 | 6/2005 | Ammar et al. | |
| 2005/0174954 A1 | 8/2005 | Yun et al. | |
| 2006/0035595 A1* | 2/2006 | Shi ................................ 455/73 |
| 2006/0052066 A1 | 3/2006 | Cleveland et al. | |

(Continued)

FOREIGN PATENT DOCUMENTS

CN     2710288     7/2005

(Continued)

OTHER PUBLICATIONS

Sierra Monolith Ics Inc, "RFICs and Evaluation Boards for WiMAX", USA, 2007 http://monolithics.com/wb/pages/products/broadband-wireless.php.

(Continued)

*Primary Examiner* — Thanh C Le
(74) *Attorney, Agent, or Firm* — D. Kligler I.P. Services Ltd

(57) ABSTRACT

A frequency conversion apparatus includes a frequency generation circuit, which is based on a first semiconductor material having a first elemental composition and is coupled to generate one or more Local Oscillator (LO) signals. The apparatus further includes a conversion circuit, which is based on a second semiconductor material having a second elemental composition different from the first elemental composition. The conversion circuit is coupled to accept an input signal in a first frequency range and to convert the input signal to an output signal in a second frequency range by mixing the input signal with the one or more LO signals.

45 Claims, 5 Drawing Sheets

U.S. PATENT DOCUMENTS

2007/0105504 A1    5/2007    Vorenkamp et al.

FOREIGN PATENT DOCUMENTS

| GB | 2412541 | 9/2005 |
| WO | WO 02/058270 | 1/2002 |
| WO | WO 03/071723 | 8/2003 |
| WO | WO 2004/056013 | 7/2004 |

OTHER PUBLICATIONS

Barrie Gilbert, "A Precise Four-Quadrant Multiplier with Subnanosecond Response", IEEE Journal of Solid-State Circuits, vol. 3, Issue 4, pp. 365-373, Dec. 1968.

International Application PCT/IL2008/001514 Search Report dated Apr. 2, 2009.

International Application PCT/IL2008/000981 Search Report dated Nov. 10, 2008.

U.S. Appl. No. 11/983,882, filed Nov. 13, 2007, Zeev Rubin et al.

Aldo Bolle, et al., "Microwave transmission in mobile networks", Ericsson Review No. 3, 2002.

Karam & Sari, "Analysis of predistortion, equalization, and ISI cancellation techniques in digital radio systems with nonlinear transmit amplifiers", IEEE Transactions on communications (37:12) Dec. 1989, pp. 1245-1253.

Karam & Sari, "A data predistortion technique with memory for QAM radio systems", IEEE transactions on-communications (39:2), Feb. 2001, pp. 336-344.

Gansman, et al., "Optimum and suboptimum frame synchronization for pilot-symbol-assisted modulation", IEEE transactions on communications (45:10), Oct. 1997, pp. 1327-1337.

"Microwave transmission in mobile networks", Ericsson Review, No. 3, 2002, pp. 124-131.

Worthen & Stark, "Unified design of iterative receivers using factor graphs", IEEE transactions on information theory, (47:2), Feb. 2001, pp. 843-849.

Richardson & Urbanke, "An introduction to the analysis of iterative coding systems", Proceedings of the 1999 Institute for Mathematics and its Applications (IMA), Summer program: Codes, Systems and Graphical Models, Minneapolis, Minnesota, Aug. 2-6, 1999.

David Trinkowon, "PHY Nomenclature", Jan. 21, 2001.

Jeff Orr, "802.16 and 802.11: the right technology in the right place", Jul. 11, 2003.

Raj Jain, Wireless metropolitan area networks \9WMANs), Washington University in St. Louis, 2006.

Evolutive™ WiMAX Series, Jan. 2006.

"IEEE 802.16 and WiMAX—a Status Review", Presented to ISAAC on Oct. 18, 2005.

Position paper, by Proxim Wireless Corporation, 2006.

Intel Technology Journal, vol. 8, Issue 3, Publishe Aug. 20, 2004.

10.0-18.0 GHz GaAs MMIC Trasmitter, MIXIM Broadband™, Rev Mar. 1, 2007, pp. 1-8.

W. Winkler, et al., "High-Frequency Low-Noise Amplifiers and Low-Jitter Oscillators in SiGe: C BiCMOS Technology", Proc. SPIE Int. Symp. On Fluctuations and Noise, Maspalomas, Gran Canaria (Spain), May 2004, Vol. 5470, Noise in Devices and Circuits II, pp. 185-192.

"ISSCC: SiGe frequency synthesizer for 60 GHz", Heise Zeitschriften Verlag, 2005.

Klepser et al., "A 10-GHz SiGe BiCMOS Phase-Locked-Loop Frequency Synthesizer", IEEE Journal of Solid-State Circuits, vol. 37, No. 3, pp. 328-335, Mar. 2002.

U.S Appl. No. 11/983,882 Official Action dated Dec. 10, 2010.

\* cited by examiner

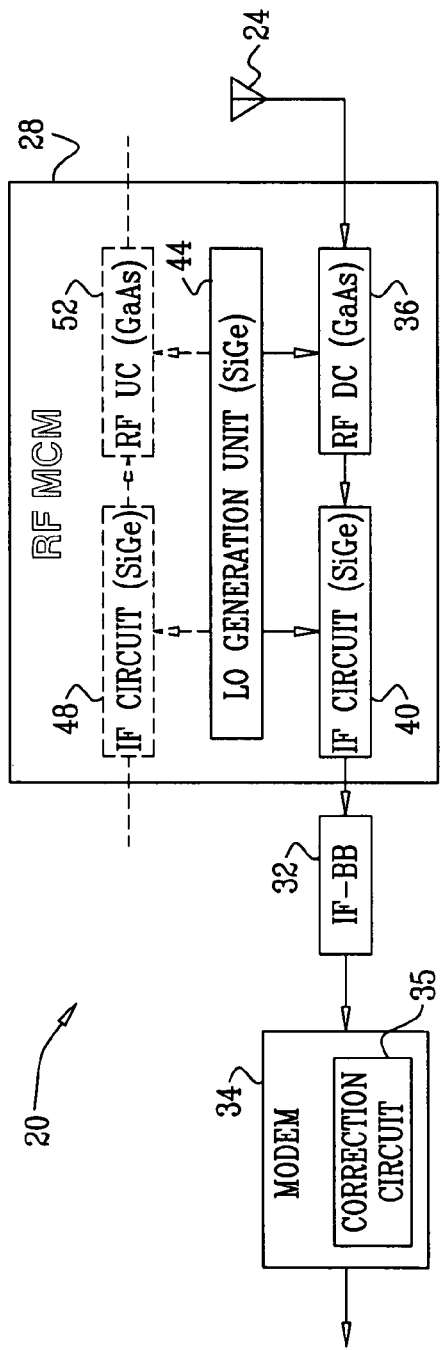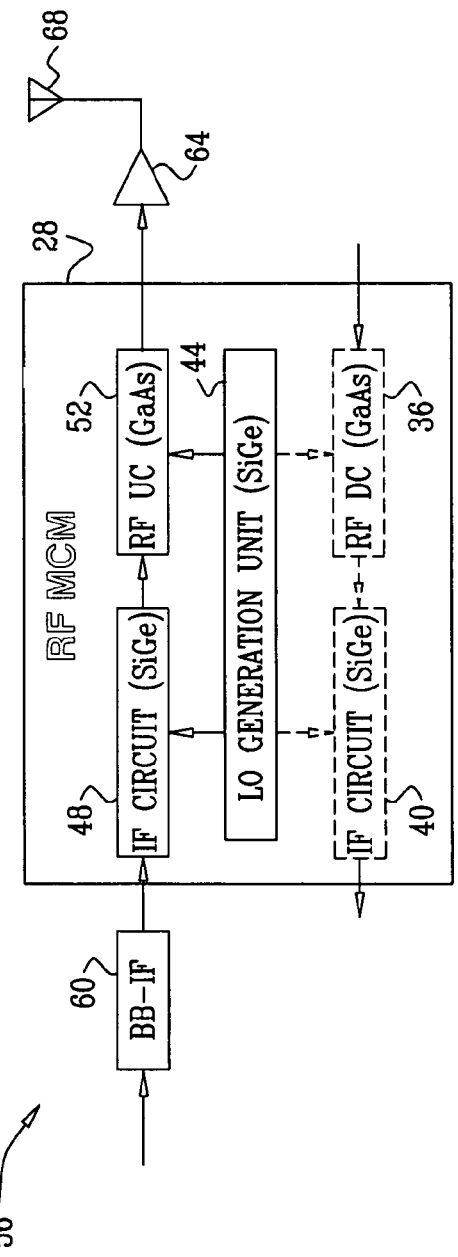

US 7,991,368 B2

INTEGRATED RF-IF CONVERTER

FIELD OF THE INVENTION

The present invention relates generally to Radio Frequency Integrated Circuits (RFICs), and particularly to RF Multi-Chip Modules (MCMs) that include multiple substrate types.

BACKGROUND OF THE INVENTION

Radio Frequency Integrated Circuits (RFICs) are commonly used for performing frequency up- and down-conversion in radio transmitters and receivers. For example, Mimix Broadband, Inc. (Houston, Tex.), produces a Gallium Arsenide (GaAs) Miniature Microwave Integrated Circuit (MMIC) transmitter device called XU1005-BD. Some RFICs are fabricated as Multi-Chip Modules (MCMs), in which multiple semiconductor dies are packaged in a single package.

SUMMARY OF THE INVENTION

Embodiments of the present invention provide a frequency conversion apparatus, including:

a frequency generation circuit, which is based on a first semiconductor material having a first elemental composition and is coupled to generate one or more Local Oscillator (LO) signals; and a conversion circuit, which is based on a second semiconductor material having a second elemental composition different from the first elemental composition, wherein the conversion circuit is coupled to accept an input signal in a first frequency range and to convert the input signal to an output signal in a second frequency range by mixing the input signal with the one or more LO signals.

In some embodiments, the first semiconductor material includes one of Silicon-Germanium (SiGe) and a metal-oxide semiconductor. In an embodiment, the second semiconductor material includes one of Silicon-Germanium (SiGe) and Gallium Arsenide (GaAs).

In another embodiment, the output signal has distortion, and the apparatus includes a digital correction circuit, which is coupled to accept the output signal and to correct the distortion to produce a corrected output signal. The digital correction circuit may include at least one circuit type selected from a group of types consisting of a carrier recovery loop, an In-phase/Quadrature (I/Q) gain imbalance compensation circuit, an I/Q phase imbalance compensation circuit and a LO leakage compensation circuit.

In yet another embodiment, the apparatus includes another conversion circuit, which is based on the second semiconductor material and is coupled to accept another input signal, which is in the second frequency range, and to convert the other input signal to produce another output signal, which is in the first frequency range. The apparatus may have a first operational mode in which the conversion circuit is active and the other conversion circuit is deactivated, and a second operational mode in which the conversion circuit is deactivated and the other conversion circuit is active.

In still another embodiment, the conversion circuit is assembled on a die of the second semiconductor material, the frequency generation circuit is assembled on a die of the first semiconductor material, and the apparatus includes a single multi-chip module package, which contains both of the dies.

In some embodiments, the conversion circuit includes at least one Image-Reject Mixing (IRM) module, which includes first and second mixers and is coupled to mix the input signal with the one or more LO signals using the first and second mixers. In an embodiment, the first frequency range is partitioned into multiple sub-bands, and the at least one IRM module includes multiple IRM modules assigned to the respective sub-bands, such that each IRM module is coupled to mix the input signal with one of the LO signals when a frequency of the input signal is in the respective sub-band.

One of the IRM modules may include a coupler, which is operative to produce first and second Quadrature components of the one of the LO signals, so as to drive the first and second mixers with the first and second Quadrature components, respectively. The coupler may include a narrowband coupler matched to a sub-band to which the one of the IRM modules is assigned.

In another embodiment, the first frequency range is partitioned into multiple sub-bands, the one or more LO signals includes multiple LO signals corresponding to the sub-bands, and the at least one IRM module includes a single broadband IRM module, which includes a switch that is operative to drive the first and second mixers with one of the multiple LO signals when a frequency of the input signal is in the respective sub-band.

In yet another embodiment, one of the first and second frequency ranges includes a Radio Frequency (RF) range, and the other of the first and second frequency ranges includes an Intermediate Frequency (IF) range. In some embodiments, the apparatus includes an IF circuit based on the first semiconductor material, which includes at least one Quadrature IF hybrid that is coupled to perform one of Quadrature combining and Quadrature splitting in the IF range. In a disclosed embodiment, the IF range is partitioned into multiple sub-bands, and the at least one Quadrature IF hybrid includes multiple IF hybrids corresponding to the respective sub-bands. The IF circuit may be further coupled to perform frequency conversion between the IF range and a third frequency range that is lower than the IF range. The third frequency range may include a baseband frequency range.

In some embodiments, the first frequency range is partitioned into at least first and second sub-bands such that the first sub-band is higher than the second sub-band, and the frequency generation circuit is coupled to set a frequency of one of the LO signals to be lower than the frequency of the input signal when the input signal is in the first sub-band, and to be higher than the frequency of the input signal when the input signal is in the second sub-band. In an embodiment, the apparatus includes a modem for producing the input signal, which is coupled to invert a spectrum of the input signal when the input signal is in one of the first and second sub-bands, and to refrain from inverting the input signal when the input signal is in the other of the first and second sub-bands.

In another embodiment, one of the first and second frequency ranges includes a Radio Frequency (RF) range, and the other of the first and second frequency ranges includes a baseband frequency range. In yet another embodiment, the conversion circuit is coupled to multiply a frequency of one of the LO signals before mixing the input signal with the one or more LO signals.

There is additionally provided, in accordance with an embodiment of the present invention, a receiver, including:

a frequency generation circuit, which is assembled on a first die of a first semiconductor material having a first elemental composition and is coupled to generate at least one Local Oscillator (LO) signal;

a Radio Frequency (RF) down-converter, which is assembled on a second die of a second semiconductor material having a second elemental composition that is different from the first elemental composition, and is coupled to accept an RF input signal and to down-convert the RF input signal to an Intermediate Frequency (IF) signal by mixing the RF signal with the at least one LO signal; and an IF down-converter, which is coupled to down-convert the IF signal produced by the RF down-converter to produce a baseband output signal.

There is also provided, in accordance with an embodiment of the present invention, a transmitter, including:

a frequency generation circuit, which is assembled on a first die of a first semiconductor material having a first elemental composition and is coupled to generate at least one Local Oscillator (LO) signal; and an up-converter, which is assembled on a second die of a second semiconductor material having a second elemental composition that is different from the first elemental composition, and is coupled to up-convert an input signal in an input frequency range to produce a Radio Frequency (RF) output signal by mixing the input signal with the at least one LO signal.

There is further provided, in accordance with an embodiment of the present invention, a method for frequency conversion, including:

accepting an input signal in a first frequency range;

generating one or more Local Oscillator (LO) signals by a frequency generation circuit, which is based on a first semiconductor material having a first elemental composition; and converting the input signal to an output signal in a second frequency range by mixing the input signal with the one or more LO signals by a conversion circuit, which is based on a second semiconductor material having a second elemental composition that is different from the first elemental composition.

The present invention will be more fully understood from the following detailed description of the embodiments thereof, taken together with the drawings in which:

BRIEF DESCRIPTION OF THE DRAWINGS

FIG. 1 is a block diagram that schematically illustrates a Radio Frequency (RF) receiver, in accordance with an embodiment of the present invention;

FIG. 2 is a block diagram that schematically illustrates an RF transmitter, in accordance with an embodiment of the present invention.

DETAILED DESCRIPTION OF EMBODIMENTS

Overview

Figure 3:
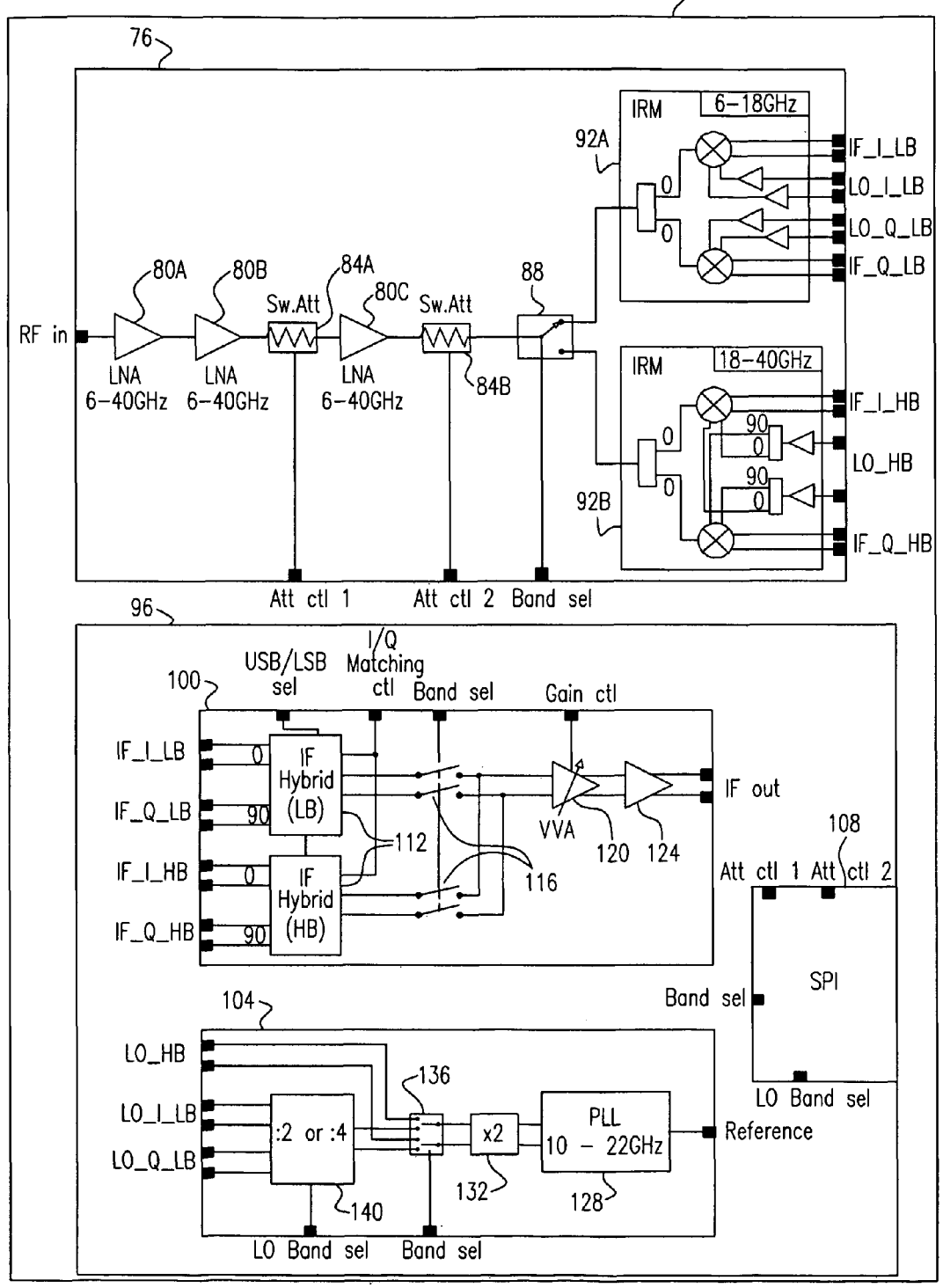
FIGS. 3-6 are block diagrams that schematically illustrate Radio Frequency Multi-Chip Modules (RF MCMs), in accordance with embodiments of the present invention.

Embodiments of the present invention that are described hereinbelow provide frequency conversion RFICs, in which Local Oscillator (LO) generation and frequency conversion are implemented using different RF technologies. Typically, the devices described herein comprise Multi-Chip Modules (MCMs), in which at least some of the frequency conversion circuitry is fabricated on a Gallium Arsenide (GaAs) die using GaAs technology, and LO generation circuitry is fabricated on a Silicon Germanium (SiGe) die using SiGe technology. In some embodiments, some of the lower-frequency conversion functions are implemented in SiGe, as well.

Several exemplary configurations of up-converting and down-converting MCMs are described below. The MCM designs described herein typically cover extremely large bandwidths, such as 6-40 GHz. In some embodiments, the entire bandwidth is covered using broadband circuits. In other embodiments, the frequency range is divided into sub-bands, which are processed separately.

The RFICs described herein are typically deployed in transmitters and receivers of digital microwave links, whose digital modulation schemes are often highly sensitive to noise. As such, these links are often designed to operate with frequency conversion circuits having low phase noise characteristics. On the other hand, SiGe LO generation circuits are often characterized by higher phase noise and other distortion, in comparison with GaAs circuits. In some embodiments, the receiver comprises a modem, which comprises a phase correction loop that corrects the phase noise that is generated partly by the SiGe LO generation circuits. The correction performed by the modem makes it feasible to use an RFIC having SiGe-based LO generation and GaAs-based frequency conversion integrated in a single package.

Unlike some known RFICs, which carry out both frequency conversion and LO generation using GaAs technology, the methods and devices described herein implement some functions using SiGe technology, whose cost is considerably lower than the cost of GaAs. Other known RFICs perform only frequency conversion, and use externally-supplied LO signals, because of the requirement for low noise performance. Unlike these known RFICs, the devices described herein perform both frequency conversion and LO generation internally. As a result, the cost and size of radio transmitters and receivers that use these devices can be reduced, and their level of integration can be increased.

System Description

FIG. 1 is a block diagram that schematically illustrates a Radio Frequency (RF) receiver 20, in accordance with an embodiment of the present invention. Receiver 20 may be part of a microwave or millimeter-wave link, or of any other suitable communication system. Receiver 20 receives Radio Frequency (RF) signals using a receiving antenna 24. The receiver receives signals over a wide range of frequencies, in the present example between 6-40 GHz, although any other suitable frequency range can also be used.

The receiver comprises an RF Multi-Chip Module (MCM) 28, which down-converts the received RF signal to a desired Intermediate Frequency (IF). The IF signal is further down-converted to baseband by an IF-to-baseband (IF-BB) converter 32. The baseband signal is sampled by an Analog-to-Digital Converter (ADC—not shown in the figure), and then processed by a modem 34. The modem comprises a digital correction circuit 35, which corrects residual phase errors, or phase noise, which may be present in the received baseband signal. In alternative embodiments, the digital correction circuit may correct other types of distortion, such as In-phase/Quadrature (I/Q) gain imbalance, I/Q phase imbalance and/or LO leakage.

(Elements that are normally found in transmitters and receivers and are not necessary for the understanding of the methods and devices described herein, such as analog-to-digital circuits, digital-to-analog circuits, filters and various control circuits, have been omitted from FIG. 1, as well as from other figures of the present patent application, for the sake of clarity.)

MCM 28 comprises multiple substrates, or semiconductor dies, of different elemental compositions and associated RF technologies. In the present patent application and in the claims, the terms "a circuit based on a certain RF technology," "a circuit based on a certain semiconductor material having a certain elemental composition" and "a circuit assembled on a certain substrate type" are used interchangeably. For example, a certain circuit may be referred to as a GaAs-based circuit, a circuit based on GaAs technology or as a circuit that is fabricated on a GaAs substrate, all meaning that the circuit is implemented using GaAs technology and processes. References to SiGe-based circuits, circuits based on SiGe technology and circuits assembled on SiGe substrates are also made interchangeably.

Figure 4:
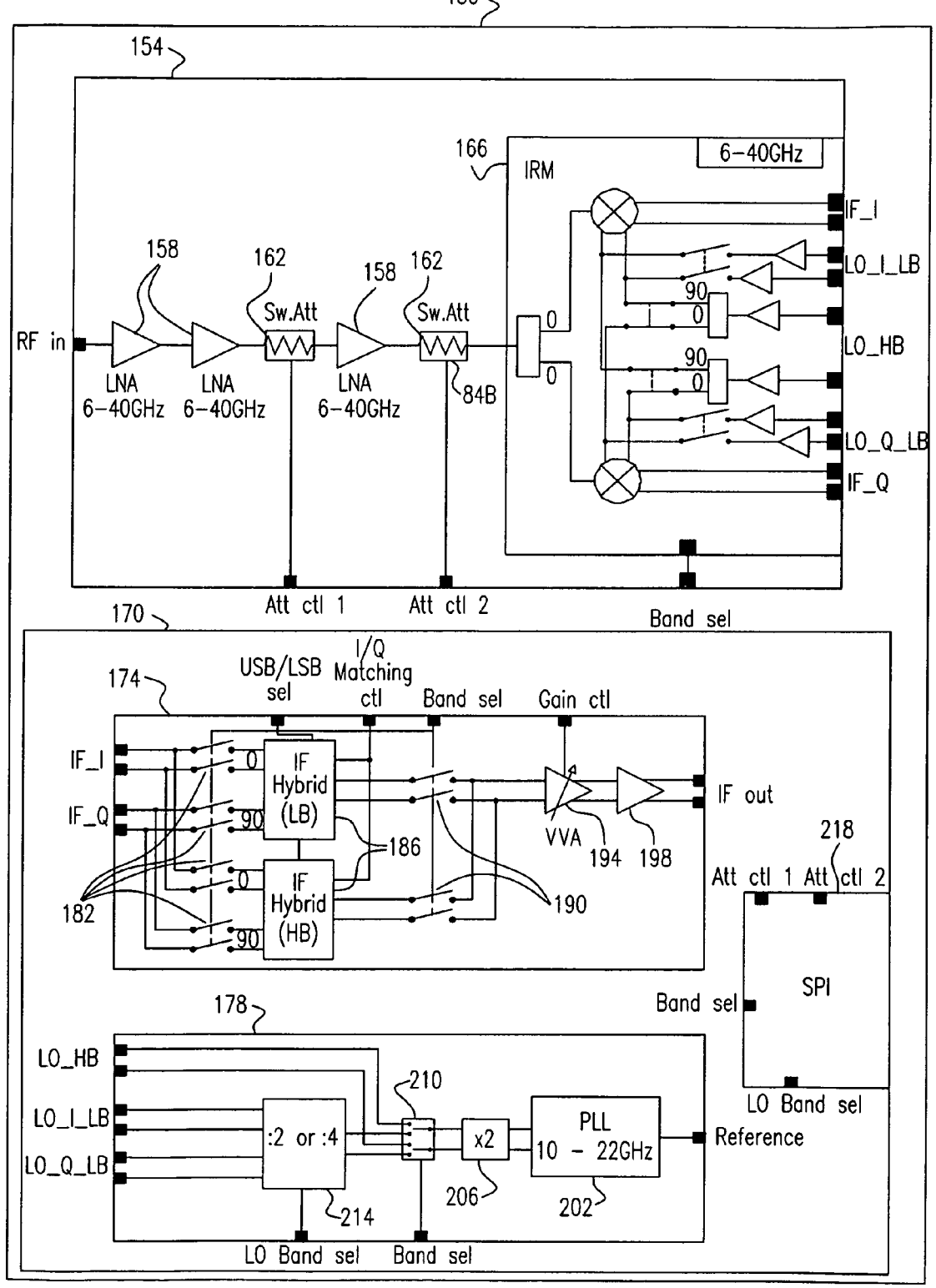

In the exemplary configuration of FIG. 1, MCM 28 comprises an RF down-converter 36, which is implemented on a GaAs substrate, and a receive IF circuit 40, which is implemented on a SiGe substrate. RF down-converter 36 down-converts the input RF signal to a certain IF frequency, typically in the range 2-3 GHz. This frequency is referred to herein as high-IF. IF-BB converter 32 down-converts the high-IF signal to baseband, sometimes via another intermediate frequency, referred to as low-IF, typically in the range 80-200 MHz. Several exemplary configurations of RF down-converter 36 and IF circuit 40 are shown in FIGS. 3 and 4 below. Although in the MCM configurations described herein IF-BB converter 32 is external to the MCM, in alternative embodiments the IF-BB converter can be implemented using SiGe technology internally to the MCM.

MCM 28 comprises a Local Oscillator (LO) generation unit 44, which generates one or more LO signals for performing the different frequency conversion operations in the MCM. Unit 44 is fabricated on a SiGe substrate. Exemplary LO generation unit configurations are shown further below.

Figure 5:
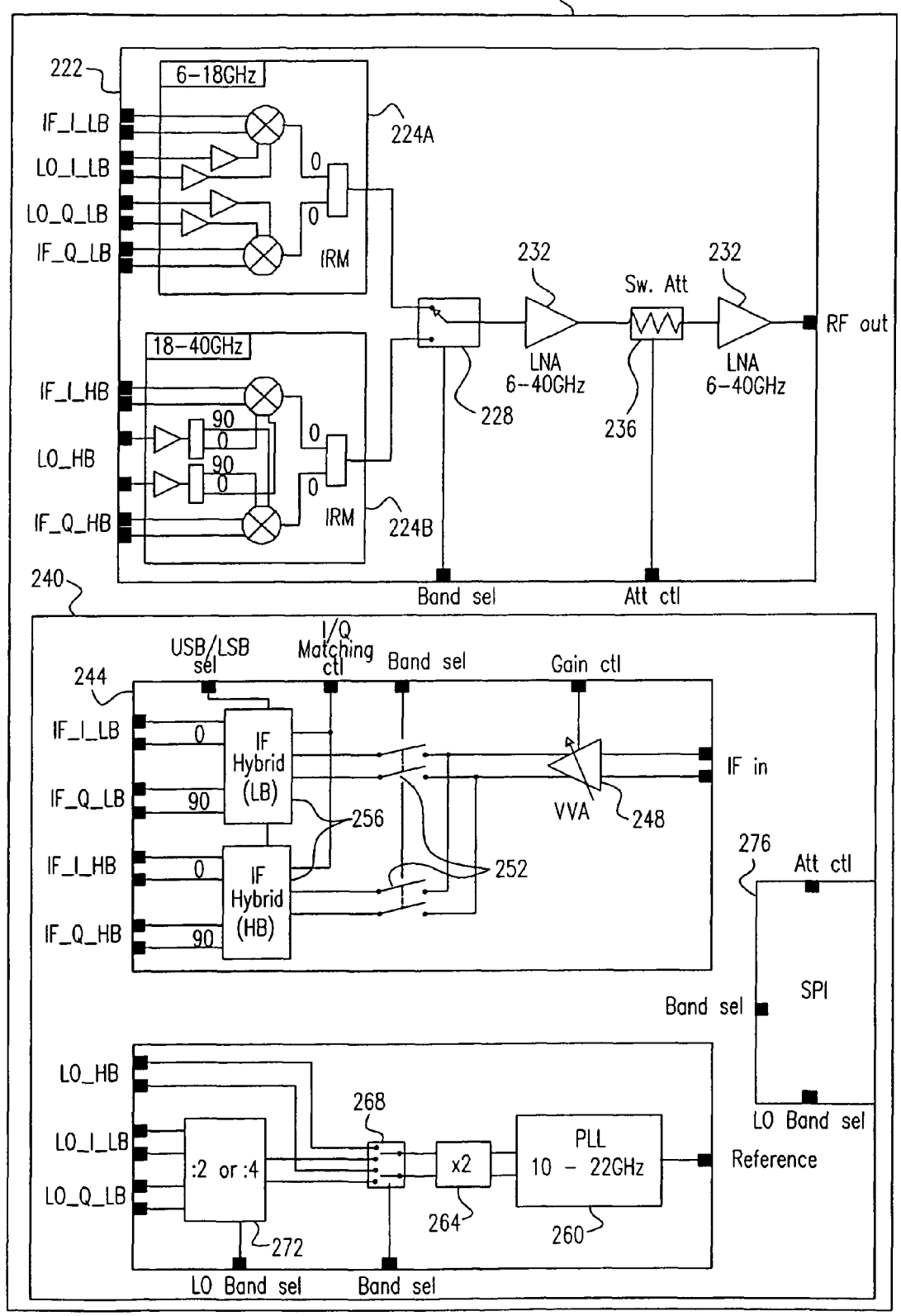
Figure 6:
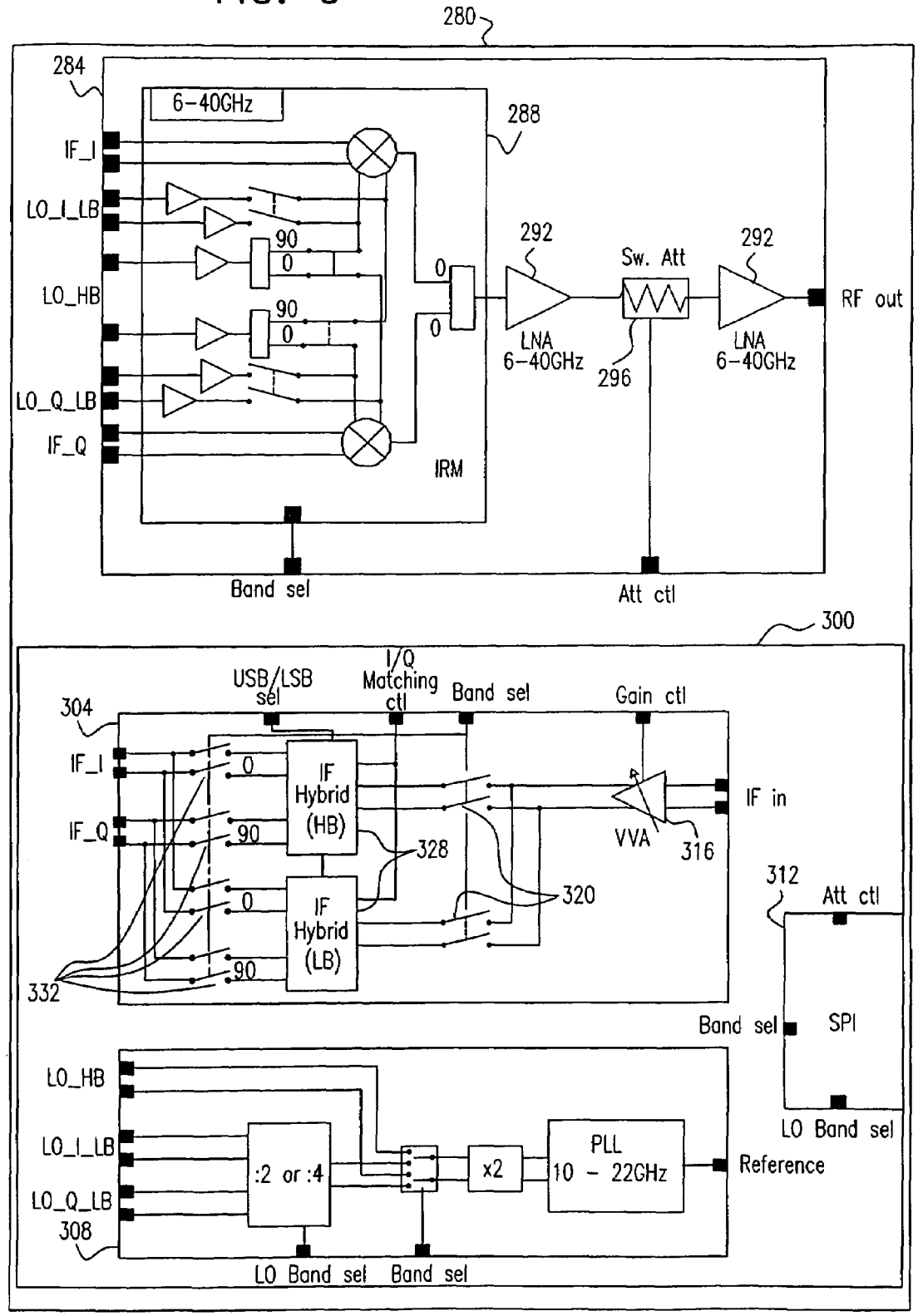

In some embodiments, MCM 28 is a dual-function device, which can be used for frequency down-conversion in a receiver, as well as for frequency up-conversion in a transmitter. For example, in the configuration of FIG. 1, MCM 28 comprises a transmit IF circuit 48, which processes input high-IF signals, and an RF up-converter 52, which converts the high-IF signals to RF. IF circuit 48 is implemented using SiGe technology, and RF up-converter 52 is implemented using GaAs technology. Exemplary RF up-converter and transmit IF circuit configurations are shown in FIGS. 5 and 6 below.

In the present example, each MCM 28 comprises both down-conversion and up-conversion circuits, and the selection is performed by hard-wiring during production. In other words, an MCM that is intended for use as a down-converter is hard-wired during production so that its RF up-converter is deactivated, its RF down-converter is active and its LO generation unit is configured to produce the appropriate LO signal for down-conversion. An MCM that is intended to function as an up-converter is hard-wired so that its RF up-converter is active, its RF down-converter is deactivated and its LO generation unit is configured to produce the LO signal for up-conversion.

In alternative embodiments, the MCM may be externally-configurable to function as a down- or up-converter after production, or even after installation in the transmitter or receiver. The MCM may comprise suitable interfaces and switching circuitry to enable external configuration of its intended function. Further alternatively, the MCM may comprise a single-function device, i.e., a device that performs only down-conversion or only up-conversion. In yet another embodiment, the MCM may perform both down-conversion and up-conversion simultaneously.

FIG. 2 is a block diagram that schematically illustrates an RF transmitter 56, in accordance with an embodiment of the present invention. Transmitter 56 comprises a baseband-to-IF (BB-IF) converter 60, which converts an input baseband signal to high-IF, sometimes via an intermediate low-IF. The transmitter comprises an RF MCM, which is similar to MCM 28 of FIG. 1 above. In the present example, however, the MCM is configured to function as an up-converter. transmit IF circuit 48 processes the input high-IF signal, and RF up-converter 52 up-converts the high-IF signal to RF. A Power Amplifier (PA) 64 amplifies the RF signal, and the signal is transmitted via a transmit antenna 68.

In alternative embodiments, BB-IF converter 60 may be implemented as part of the MCM. Further alternatively, the MCM may perform direct up-conversion from baseband to RF, thus eliminating the need for BB-IF converter 60. The different MCM configurations enable various system partitioning and installation schemes. For example, in a certain configuration, conversion between baseband and IF are performed in an Indoor Unit (IDU) and conversion between IF and RF are performed in an Outdoor Unit (ODU). The ODU and IDU are connected by a transmission line, such as a coaxial cable, which carries IF signals. Alternatively, the entire conversion between baseband and RF (either directly of via one or more intermediate frequencies) can be performed in a single unit.

Exemplary MCM Configurations

FIGS. 3-6 are block diagrams that schematically illustrate several exemplary configurations of RF MCMs, in accordance with embodiments of the present invention. FIGS. 3 and 4 show exemplary configurations of RF down-converters, receive IF circuits and associated LO generation units. FIGS. 5 and. 6 show exemplary configurations of RF up-converters, transmit IF circuits and associated LO generation units.

FIG. 3 shows a down-converting RF MCM 72. MCM 72 comprises an RF down-converter 76, which is fabricated using GaAs technology, and a SiGe assembly 96, which comprises a receive IF circuit 100, an LO generation unit 104 and an interface and control unit 108, all fabricated using SiGe technology.

RF Down-converter 76 accepts an input RF signal, using a single-ended RF port. The input RF signal is amplified by a chain of three Low Noise Amplifiers (LNAs) 80A . . . 80C. The gain of the LNA chain can be controlled by switched attenuators 84A and 84B. The LNA chain is broadband and covers the entire range of RF signals for which the MCM is specified, e.g., 6-40 GHz.

Following the broadband low-noise amplification, the down-conversion operations of MCM 72 are performed in one of two sub-bands. The MCM is typically pre-configured to operate in one of the two sub-bands, either at production or during installation. In the present example, one sub-band covers 6-18 GHz and the other sub-band covers 18-40 GHz. In the RF down-converter, a band-select switch 88 selects one of the two sub-bands.

The RF down-converter comprises two Image-Reject Mixers (IRMs) 92A and 92B, which respectively cover the 6-18 and 18-40 GHz sub-bands. Each IRM accepts an LO signal from LO generation unit 104, and converts the RF signal to high-IF. IRM 92A accepts a Quadrature LO signal, i.e., two LO components having a 90° phase shift with respect to one another. The two LO components are denoted LO_I_LB and LO_Q_LB in the figure. The IRM mixes the RF signal with the two LO components using two respective mixers, and produces a Quadrature IF output signal, denoted IF_I_LB and IF_Q_LB. In the present example, the output of IRM 92A has a frequency of 1630 MHz, although any other suitable frequency can also be used.

IRM 92B accepts a single LO signal (denoted LO_HB) from LO generation unit 104, and splits it into two Quadrature components internally. The IRM comprises a suitable 0°/90° coupler implemented in GaAs technology, such as a Lange coupler, for splitting the LO signal into Quadrature components. The IRM mixes the RF signal with the two Quadrature LO components using two respective mixers, and produces a Quadrature IF output, whose components are denoted IF_I_HB and IF_Q_HB. In the present example, the output of IRM 92B has a frequency of 3260 MHz, although any other suitable frequency can also be used.

The different LO signals and IF outputs of the two IRMs are routed between assembly 76 and assembly 96 over differential interfaces. The mixers in IRMs 92A and 92B typically comprise Single-Balanced Mixers (SBMs). In some embodiments, the IRMs comprise internal driver amplifiers, which amplify the LO signals to the appropriate power levels for driving the mixers.

Receive IF circuit 100 comprises two IF hybrids (Quadrature combiners) 112, which respectively combine the Quadrature high-IF outputs of IRMs 92A and 92B. Switches 116 select the sub-band that is currently used. A Voltage Variable Attenuator (VVA) 120 applies variable-gain amplification to the signal. The signal is further amplified by an amplifier 124, and provided as output. As can be seen in the figure, the entire receive IF circuit is implemented using a differential configuration.

LO generation unit 104 accepts an external reference clock signal, which is used as a reference for the different LO signals. A Phase Locked Loop (PLL) 128 produces a signal in the range of 10-22 GHz. A frequency doubler 132 doubles the frequency of the PLL output, to produce an LO signal in the range 20-44 GHz. A band-select switch 136 selects the sub-band that is currently in use. When operating in the upper sub-band, i.e., between 18-40 GHz, the LO signal produced by doubler 132 (LO_HB) is provided as is to IRM 92B. When operating in the lower sub-band, i.e., between 6-18 GHz, the output of doubler 132 is divided by a factor of either two or four using an externally-controlled frequency divider 140. The frequency divider also splits the LO signal into two Quadrature components (LO_I_LB and LO_Q_LB), and the two components are provided to IRM 92A.

Interface and control unit 108 communicates with an external controller or host, such as using a Serial Peripheral Interface (SPI). In response to commands accepted from the host, the interface and control unit controls switches 88, 116 and 136 to select the appropriate sub-band, controls divider 140 to select the appropriate division ratio within the lower sub-band, and sets the appropriate gains or attenuations of switched attenuators 84A and 84B and VVA 120.

FIG. 4 shows a down-converter RF MCM 150, in accordance with an alternative embodiment of the present invention. MCM 150 comprises an RF down-converter 154, fabricated using GaAs technology, and a SiGe assembly 170, which comprises a receive IF circuit 174, an LO generation unit 178 and an interface and control unit 218, all fabricated using SiGe technology.

RF down-converter 154 comprises three LNAs 158 and switched attenuators 162, which are similar to LNAs 80A . . . 80C and switched attenuators 84A and 84B in down-converter 76 of FIG. 3 above. In the present example, however, RF down-converter 154 comprises a single broadband IRM 166, whose mixers cover the entire 6-40 GHz range. IRM 166 accepts separate LO signals for operating in the 6-18 and 18-40 GHz sub-bands. The LO signals (LO_I_LB, LO_Q_LB and LO_HB) are similar to the LO signals described in FIG. 3 above. IRM 166 comprises internal band-select switches, which select the sub-band that is currently in use, so as to drive the mixers with the appropriate LO signals. IRM 166 produces a Quadrature high-IF signal denoted IF_I, IF_Q. Each of the IF signal components is provided as a differential signal.

Receive IF circuit 174 accepts IF signals IF_I and IF_Q, and routes them through one of two IF hybrids 186 using band-select switches 182 and 190, depending on the sub-band that is currently in use. IF hybrids 186 are similar to hybrids 112 of FIG. 3 above, with a separate hybrid assigned to each sub-band. The signal produced by the appropriate hybrid 186 is amplified by a VVA 194 and an amplifier 198, which are similar to VVA 120 and amplifier 124 of FIG. 3 above. The output of amplifier 198 is provided as the IF output of the MCM.

LO generation unit 178 is similar to unit 104 of FIG. 3 above. Unit 178 comprises a PLL 202, a frequency doubler 206, a switch 210 and a frequency divider 214, which operate similarly to PLL 128, frequency doubler 132, switch 136 and frequency divider 140 of FIG. 3 above. Interface and control unit 218 is similar to unit 108 of FIG. 3 above.

FIG. 5 shows an up-converter RF MCM 220, in accordance with another embodiment of the present invention. MCM 220 comprises an RF up-converter 222, which is fabricated using GaAs technology, and a SiGe assembly 240, which comprises a transmit IF circuit 244, an LO generation unit 246 and an interface and control unit 276, all fabricated using SiGe technology.

MCM 220 accepts as input a high-IF signal. The input signal is provided to circuit 244 and is amplified by a VVA 248. A band-select switch 252 routes the amplified high-IF signal to one of two IF hybrids (Quadrature splitters) 256, which split the high-IF signal into In-phase and Quadrature components. One of the hybrids covers the 6-18 GHz sub-band and produces a Quadrature signal denoted IF_I_LB, IF_Q_LB. The other hybrid covers the 18-40 GHz sub-band and produces a Quadrature signal denoted IF_I_HB, IF_Q_HB.

In the present example, the frequency of IF_I_LB and IF_Q_LB is 2120 MHz, and the frequency of IF_I_HB and IF_Q_HB is 3750 MHz, although any other suitable frequencies can also be used. The high-IF signals are provided to RF up-converter 222 using a differential interface.

RF up-converter 222 comprises two IRMs 224A and 224B, which cover the 6-18 and 18-40 GHz sub-bands, respectively. In each IRM, the high-IF signals are mixed with appropriate LO signals using a pair of mixers, so as to convert the high-IF signals to RF. When operating in the 6-18 GHz sub-band, IRM 224A accepts a Quadrature LO signal (LO_I_LB, LO_Q_LB) from LO generation unit 246. When operating in the 18-40 sub-band, IRM 224B accepts a single LO signal (LO_HB) from the LO generation unit, and splits it into Quadrature components internally.

A band-select switch 228 selects the RF output of the appropriate IRM. The RF signal is amplified by a broadband amplification chain, which covers the entire 6-40 GHz range. The amplification chain comprises two LNAs 232 and a switched attenuator 236, which sets the gain of the amplification chain. The output of the amplification chain is provided as RF output of the MCM.

LO generation unit 246 is similar to unit 104 of FIG. 3 above. Unit 246 comprises a PLL 260, a frequency doubler 264, a switch 268 and a frequency divider 272, which operate similarly to PLL 128, frequency doubler 132, switch 136 and frequency divider 140 of FIG. 3 above. Interface and control unit 276 is similar to unit 108 of FIG. 3 above.

FIG. 6 shows an up-converter RF MCM 280, in accordance with yet another embodiment of the present invention. MCM 280 comprises an RF up-converter 284, which is fabricated using GaAs technology, and a SiGe assembly 300, which comprises a transmit IF circuit 304, an LO generation unit 308 and an interface and control unit 312, all fabricated using SiGe technology. LO generation unit 308 and interface and control unit 312 are similar to the corresponding units in FIGS. 3-5 above.

MCM 280 accepts as input a high-IF signal, which is amplified by a VVA 316. A band-select switch 320 switches the signal to one of two IF hybrids 328, similar to hybrids 256 of FIG. 5 above. Each hybrid covers one of the two sub-bands. In the present embodiment, however, another band-select switch 332 switches the outputs of the appropriate hybrid 328 to a single Quadrature IF interface, denoted IF_I, IF_Q. This signal is provided as input to RF up-converter 284. Thus, the high-IF signal IF_I, IF_Q provided to the RF up-converter may be located anywhere within the 6-40 GHz band.

RF up-converter 284 up-converts the high-IF signal using a broadband IRM 288, whose mixers cover the entire 6-40 GHz range. IRM 288 accepts both Quadrature LO signals for the lower sub-band (LO_I_LB, LO_Q_LB), and an LO signal for the upper sub-band (LO_HB). The IRM splits LO signal LO_HB into two Quadrature components internally. The IRM comprises band-select switches, which drive the broadband mixers with the appropriate LO signals depending on the currently-used sub-band.

An amplification chain, which comprises two LNAs 292 and a switched attenuator 296, amplifies the RF signal produced by IRM 288. The output of the amplification chain is provided as RF output of the MCM.

In any of the SiGe assemblies described above, the SiGe assembly may comprise one or more SiGe dies. For example, the LO generation unit and interface and control unit may be assembled on the same die, either together with or separately from the transmit or receive IF circuit. Alternatively, the entire SiGe assembly may be fabricated on the same die. Further alternatively, each of the transmit IF circuit, the receive IF circuit, the LO generation unit and the interface and control unit may be fabricated on a separate die.

Additional Embodiments and Variations

The MCM configurations of FIGS. 3-6 illustrate single-function MCMs, i.e., MCMs that perform only up-conversion or only down-conversion. In some embodiments, elements of these single-function MCMs can be combined in a single MCM to provide dual-function MCMs, such as MCM 28 of FIGS. 1 and 2 above. For example, RF down-converter 76, receive IF circuit 100 and LO generation unit 104 of FIG. 3 above can be integrated with transmit IF circuit 244 and RF up-converter 222 of FIG. 5 above in a single MCM. Similarly, RF down-converter 154, receive IF circuit 174 and LO generation unit 178 of FIG. 4 above can be integrated with transmit IF circuit 304 and RF up-converter 284 of FIG. 6 above in a single MCM. In some embodiments, the dual-function MCM may comprise a single synthesized frequency source for both up- and down-conversion operations. Such a configuration may reduce internal noise and interference effects.

The SiGe elements of the dual-function MCM may be fabricated on a single SiGe die or on multiple dies. Similarly, the GaAs elements of the dual-function MCM may be fabricated on one or more GaAs dies.

Although the embodiments described herein mainly address MCMs that perform frequency conversion between high-IF and RF, the principles of the present invention can also be used for performing direct conversion from baseband to RF, as well. For example, a baseband signal may be converted directly to RF by a direct-conversion up-converter fabricated using GaAs technology. The direct-conversion up-converter may comprise an amplification chain and either one broadband IRM or multiple IRMs assigned to up-convert respective sub-bands. An LO generation unit, which generates the LO signals for the direct-conversion up-converter can be fabricated using SiGe technology. The direct-conversion GaAs up-converter and the SiGe LO generation unit, with possibly an interface and control unit, can be integrated in a single MCM. Moreover, such a direct-conversion up-converter can be integrated with one of the down-converter configurations described herein.

In some applications, it is possible to restrict the RF and IF frequencies in which the transmitter or receiver (and hence the RF MCM) operates, rather than operating over the full 6-40 GHz range. The restriction may limit the frequencies to a narrow range, or even to a single operating frequency. As noted above, in some embodiments, the GaAs IRMs split the LO signal into Quadrature components internally, using an 0°/90° coupler. In these embodiments, when the operating frequency range of the MCM is restricted to a narrow range, the coupler design may be optimized for the specific frequency band in question. As a result, the coupler may have smaller size and/or better performance, in comparison with conventional broadband couplers.

In any of the frequency conversion operations described herein, the frequency of the LO signal may be either higher or lower than the converted signal. In some embodiments, the LO generation unit generates LO frequencies, which are higher than the converted signal when operating in the lower sub-band, and lower than the converted signal when operating in the upper sub-band. This technique considerably reduces the range of LO frequencies, which simplifies the LO generation unit and improves its performance. Note, however, that a signal that is converted with an LO frequency higher than the signal frequency has a spectrum, which is reversed in comparison with the spectrum of a signal that is converted with an LO frequency lower than the signal frequency. In order to retain the desired signal spectrum, the transmitter or receiver may apply spectrum inversion. This operation is typically carried out by the modem of the transmitter or receiver.

In some embodiments, the LO generation unit produces an LO signal whose frequency is a fraction (e.g., ½ or ¼) of the desired LO frequency. The RF up- and/or down-converter multiplies the frequency of the LO signal before applying it to the mixers. For example, the LO generation unit may produce an LO signal in the range 10-20 GHz, and the RF up- and/or down-converter may selectively double the LO signal when appropriate, so as to produce LO signals in the range 10-40 GHz.

Although the embodiments described herein mainly address RF MCMs comprising SiGe and GaAs substrates, the methods and systems described herein can also be used to provide RF MCMs using other types of substrates and technologies that are based on other semiconductor materials. For example, the IF circuits, LO generation circuitry and/or the interface and control units may be implemented using Complementary Metal-Oxide Semiconductor (CMOS) technology. As another example, the RF up- and down-converters, and in particular the IRMs, may be implemented using SiGe technology rather than using GaAs.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A frequency conversion apparatus, comprising:
   a frequency generation circuit, which is based on a first semiconductor material having a first elemental composition and is coupled to generate one or more Local Oscillator (LO) signals; and
   a conversion circuit, which is based on a second semiconductor material having a second elemental composition different from the first elemental composition, wherein the conversion circuit is coupled to accept an input signal in a first frequency range and to convert the input signal to an output signal in a second frequency range by mixing the input signal with the one or more LO signals,
   wherein the conversion circuit comprises at least one Image-Reject Mixing (IRM) module, which comprises first and second mixers and is coupled to mix the input signal with the one or more LO signals using the first and second mixers,
   wherein the first frequency range is partitioned into multiple sub-bands, and wherein the at least one IRM module comprises multiple IRM modules assigned to the respective sub-bands, such that each IRM module is coupled to mix the input signal with one of the LO signals when a frequency of the input signal is in the respective sub-band.

2. The apparatus according to claim 1, wherein the first semiconductor material comprises one of Silicon-Germanium (SiGe) and a metal-oxide semiconductor.

3. The apparatus according to claim 1, wherein the second semiconductor material comprises one of Silicon-Germanium (SiGe) and Gallium Arsenide (GaAs).

4. The apparatus according to claim 1, wherein the output signal has distortion, and the apparatus comprises a digital correction circuit, which is coupled to accept the output signal and to correct the distortion to produce a corrected output signal.

5. The apparatus according to claim 4, wherein the digital correction circuit comprises at least one circuit type selected from a group of types consisting of a carrier recovery loop, an In-phase/Quadrature (I/Q) gain imbalance compensation circuit, an I/Q phase imbalance compensation circuit and a LO leakage compensation circuit.

6. The apparatus according to claim 1, and comprising another conversion circuit, which is based on the second semiconductor material and is coupled to accept another input signal, which is in the second frequency range, and to convert the other input signal to produce another output signal, which is in the first frequency range.

7. The apparatus according to claim 1, wherein the conversion circuit is assembled on a die of the second semiconductor material, wherein the frequency generation circuit is assembled on a die of the first semiconductor material, and comprising a single multi-chip module package, which contains both of the dies.

8. The apparatus according to claim 1, wherein one of the IRM modules comprises a coupler, which is operative to produce first and second Quadrature components of the one of the LO signals, so as to drive the first and second mixers with the first and second Quadrature components, respectively.

9. The apparatus according to claim 8, wherein the coupler comprises a narrowband coupler matched to a sub-band to which the one of the IRM modules is assigned.

10. The apparatus according to claim 1, wherein one of the first and second frequency ranges comprises a Radio Frequency (RF) range, and wherein the other of the first and second frequency ranges comprises an Intermediate Frequency (IF) range.

11. The apparatus according to claim 10, and comprising an IF circuit based on the first semiconductor material, which comprises at least one Quadrature IF hybrid that is coupled to perform one of Quadrature combining and Quadrature splitting in the IF range.

12. The apparatus according to claim 10, wherein the IF range is partitioned into multiple sub-bands, and wherein the at least one Quadrature IF hybrid comprises multiple IF hybrids corresponding to the respective sub-bands.

13. The apparatus according to claim 10, wherein the IF circuit is further coupled to perform frequency conversion between the IF range and a third frequency range that is lower than the IF range.

14. The apparatus according to claim 13, wherein the third frequency range comprises a baseband frequency range.

15. The apparatus according to claim 1, wherein one of the first and second frequency ranges comprises a Radio Frequency (RF) range, and wherein the other of the first and second frequency ranges comprises a baseband frequency range.

16. The apparatus according to claim 1, wherein the conversion circuit is coupled to multiply a frequency of one of the LO signals before mixing the input signal with the one or more LO signals.

17. A frequency conversion apparatus, comprising:
   a frequency generation circuit, which is based on a first semiconductor material having a first elemental composition and is coupled to generate one or more Local Oscillator (LO) signals;
   a conversion circuit, which is based on a second semiconductor material having a second elemental composition different from the first elemental composition, wherein the conversion circuit is coupled to accept an input signal in a first frequency range and to convert the input signal to an output signal in a second frequency range by mixing the input signal with the one or more LO signals; and
   another conversion circuit, which is based on the second semiconductor material and is coupled to accept another input signal, which is in the second frequency range, and to convert the other input signal to produce another output signal, which is in the first frequency range,
   wherein the apparatus has a first operational mode in which the conversion circuit is active and the other conversion circuit is deactivated, and a second operational mode in which the conversion circuit is deactivated and the other conversion circuit is active.

18. A frequency conversion apparatus, comprising:
   a frequency generation circuit, which is based on a first semiconductor material having a first elemental composition and is coupled to generate one or more Local Oscillator (LO) signals; and
   a conversion circuit, which is based on a second semiconductor material having a second elemental composition different from the first elemental composition, wherein the conversion circuit is coupled to accept an input signal in a first frequency range and to convert the input signal to an output signal in a second frequency range by mixing the input signal with the one or more LO signals,
   wherein the conversion circuit comprises at least one Image-Reject Mixing (IRM) module, which comprises first and second mixers and is coupled to mix the input signal with the one or more LO signals using the first and second mixers, wherein the first frequency range is partitioned into multiple sub-bands, wherein the one or more LO signals comprises multiple LO signals corresponding to the sub-bands, and wherein the at least one IRM module comprises a single broadband IRM module, which comprises a switch that is operative to drive the first and second mixers with one of the multiple LO signals when a frequency of the input signal is in the respective sub-band.

19. A frequency conversion apparatus, comprising:
a frequency generation circuit, which is based on a first semiconductor material having a first elemental composition and is coupled to generate one or more Local Oscillator (LO) signals; and
a conversion circuit, which is based on a second semiconductor material having a second elemental composition different from the first elemental composition, wherein the conversion circuit is coupled to accept an input signal in a first frequency range and to convert the input signal to an output signal in a second frequency range by mixing the input signal with the one or more LO signals,
wherein the first frequency range is partitioned into at least first and second sub-bands such that the first sub-band is higher than the second sub-band, and wherein the frequency generation circuit is coupled to set a frequency of one of the LO signals to be lower than the frequency of the input signal when the input signal is in the first sub-band, and to be higher than the frequency of the input signal when the input signal is in the second sub-band.

20. The apparatus according to claim 19, and comprising a modem for producing the input signal, which is coupled to invert a spectrum of the input signal when the input signal is in one of the first and second sub-bands, and to refrain from inverting the input signal when the input signal is in the other of the first and second sub-bands.

21. A receiver, comprising:
a frequency generation circuit, which is assembled on a first die of a first semiconductor material having a first elemental composition and is coupled to generate at least one Local Oscillator (LO) signal;
a Radio Frequency (RF) down-converter, which is assembled on a second die of a second semiconductor material having a second elemental composition that is different from the first elemental composition, and is coupled to accept an RF input signal and to down-convert the RF input signal to an Intermediate Frequency (IF) signal by mixing the RF signal with the at least one LO signal; and
an IF down-converter, which is coupled to down-convert the IF signal produced by the RF down-converter to produce a baseband output signal,
wherein the RF down-converter comprises at least one Image-Reject Mixing (IRM) module, which comprises first and second mixers and is coupled to mix the input RF signal with the at least one LO signal using the first and second mixers,
wherein the RF input signal is in a first frequency range that is partitioned into multiple sub-bands, and wherein the at least one IRM module comprises multiple IRM modules assigned to the respective sub-bands, such that each IRM module is coupled to mix the RF input signal with the LO signal when a frequency of the RF input signal is in the respective sub-band.

22. The receiver according to claim 21, and comprising a multi-chip module package, which contains the first and second dies.

23. The receiver according to claim 21, wherein the baseband output signal has distortion, and comprising a modem, which is coupled to accept the baseband output signal and to correct the distortion.

24. A transmitter, comprising:
a frequency generation circuit, which is assembled on a first die of a first semiconductor material having a first elemental composition and is coupled to generate at least one Local Oscillator (LO) signal; and
an up-converter, which is assembled on a second die of a second semiconductor material having a second elemental composition that is different from the first elemental composition, and is coupled to up-convert an input signal in an input frequency range to produce a Radio Frequency (RF) output signal by mixing the input signal with the at least one LO signal
wherein the up-converter comprises at least one Image-Reject Mixing (IRM) module, which comprises first and second mixers and is coupled to mix the input signal with the at least one LO signal using the first and second mixers,
wherein the input frequency range is partitioned into multiple sub-bands, and wherein the at least one IRM module comprises multiple IRM modules assigned to the respective sub-bands, such that each IRM module is coupled to mix the input signal with the LO signal when a frequency of the input signal is in the respective sub-band.

25. The transmitter according to claim 24, and comprising a multi-chip module package, which contains the first and second dies.

26. The transmitter according to claim 24, wherein the input frequency range comprises one of an Intermediate Frequency (IF) range and a baseband frequency range.

27. A method for frequency conversion, comprising:
accepting an input signal in a first frequency range;
generating one or more Local Oscillator (LO) signals by a frequency generation circuit, which is based on a first semiconductor material having a first elemental composition; and
converting the input signal to an output signal in a second frequency range by mixing the input signal with the one or more LO signals by a conversion circuit, which is based on a second semiconductor material having a second elemental composition that is different from the first elemental composition,
wherein converting the input signal comprises mixing the input signal with the one or more LO signals using at least one Image-Reject Mixing (IRM) module that is based on the second semiconductor material,
wherein the first frequency range is partitioned into multiple sub-bands, wherein the at least one IRM module includes multiple IRM modules assigned to the respective sub-bands, and wherein mixing the input signal with the one or more LO signals comprises mixing the input signal with one of the LO signals by a respective IRM module when a frequency of the input signal is in the sub-band to which the IRM module is assigned.

28. The method according to claim 27, wherein the first semiconductor material comprises one of Silicon-Germanium (SiGe) and a metal-oxide semiconductor.

29. The method according to claim 27, wherein the second semiconductor material comprises one of Silicon-Germanium (SiGe) and Gallium Arsenide (GaAs).

30. The method according to claim 27, wherein the output signal has distortion, and comprising correcting the distortion to produce a corrected output signal.

31. The method according to claim 30, wherein correcting the distortion comprises correcting at least one distortion type selected from a group of types consisting of phase distortion, In-phase/Quadrature (I/Q) gain imbalance, I/Q phase imbalance and LO leakage.

32. The method according to claim 27, and comprising accepting another input signal, which is in the second frequency range, and converting the other input signal to produce another output signal, which is in the first frequency range, by another conversion circuit that is based on the second semiconductor material.

33. The method according to claim 27, wherein one of the IRM modules includes first and second mixers and a coupler, and wherein mixing the input signal with the one of the LO signals comprises producing first and second Quadrature components of the one of the LO signals by the coupler, and driving the first and second mixers with the first and second Quadrature components, respectively.

34. The method according to claim 33, wherein the coupler comprises a narrowband coupler matched to a sub-band to which the one of the IRM modules is assigned.

35. The method according to claim 27, wherein one of the first and second frequency ranges comprises a Radio Frequency (RF) range, and wherein the other of the first and second frequency ranges comprises an Intermediate Frequency (IF) range.

36. The method according to claim 35, and comprising performing one of Quadrature combining and Quadrature splitting in the IF range using at least one Quadrature IF hybrid in an IF circuit based on the first semiconductor material.

37. The method according to claim 27, wherein one of the first and second frequency ranges comprises a Radio Frequency (RF) range, and wherein the other of the first and second frequency ranges comprises a baseband frequency range.

38. The method according to claim 27, wherein converting the input signal comprises multiplying a frequency of one of the LO signals by the conversion circuit before mixing the input signal with the one or more LO signals.

39. A method for frequency conversion, comprising:
accepting an input signal in a first frequency range;
generating one or more Local Oscillator (LO) signals by a frequency generation circuit, which is based on a first semiconductor material having a first elemental composition;
converting the input signal to an output signal in a second frequency range by mixing the input signal with the one or more LO signals by a conversion circuit, which is based on a second semiconductor material having a second elemental composition that is different from the first elemental composition; and
accepting another input signal, which is in the second frequency range, and converting the other input signal to produce another output signal, which is in the first frequency range, by another conversion circuit that is based on the second semiconductor material,
wherein converting the input signal comprises activating the conversion circuit and deactivating the other conversion circuit, and wherein converting the other input signal comprises activating the other conversion circuit and deactivating the conversion circuit.

40. A method for frequency conversion, comprising:
accepting an input signal in a first frequency range;
generating one or more Local Oscillator (LO) signals by a frequency generation circuit, which is based on a first semiconductor material having a first elemental composition; and
converting the input signal to an output signal in a second frequency range by mixing the input signal with the one or more LO signals by a conversion circuit, which is based on a second semiconductor material having a second elemental composition that is different from the first elemental composition,
wherein converting the input signal comprises mixing the input signal with the one or more LO signals using at least one Image-Reject Mixing (IRM) module that is based on the second semiconductor material,
wherein the first frequency range is partitioned into multiple sub-bands, wherein the one or more LO signals comprises multiple LO signals corresponding to the sub-bands, wherein the at least one IRM module comprises a single broadband IRM module that includes first and second mixers, and wherein mixing the input signal comprises driving the first and second mixers with one of the multiple LO signals when a frequency of the input signal is in the respective sub-band.

41. A method for frequency conversion, comprising:
accepting an input signal in a first frequency range;
generating one or more Local Oscillator (LO) signals by a frequency generation circuit, which is based on a first semiconductor material having a first elemental composition; and
converting the input signal to an output signal in a second frequency range by mixing the input signal with the one or more LO signals by a conversion circuit, which is based on a second semiconductor material having a second elemental composition that is different from the first elemental composition,
wherein one of the first and second frequency ranges comprises a Radio Frequency (RF) range, and wherein the other of the first and second frequency ranges comprises an Intermediate Frequency (IF) range,
and comprising performing one of Quadrature combining and Quadrature splitting in the IF range using at least one Quadrature IF hybrid in an IF circuit based on the first semiconductor material,
wherein the IF range is partitioned into multiple sub-bands, and wherein performing the one of the Quadrature combining and the Quadrature splitting comprises deploying multiple IF hybrids that are assigned to the respective sub-bands.

42. The method according to claim 41, and comprising performing frequency conversion between the IF range and a third frequency range that is lower than the IF range using the IF circuit.

43. The method according to claim 42, wherein the third frequency range comprises a baseband frequency range.

44. A method for frequency conversion, comprising:
accepting an input signal in a first frequency range;
generating one or more Local Oscillator (LO) signals by a frequency generation circuit, which is based on a first semiconductor material having a first elemental composition; and
converting the input signal to an output signal in a second frequency range by mixing the input signal with the one or more LO signals by a conversion circuit, which is based on a second semiconductor material having a second elemental composition that is different from the first elemental composition, wherein the first frequency range is partitioned into at least first and second sub-bands such that the first sub-band is higher than the second sub-band, and wherein generating the one or more LO signals comprises setting a frequency of one of the LO signals to be lower than the frequency of the input signal when the input signal is in the first sub-band, and to be higher than the frequency of the input signal when the input signal is in the second sub-band.

45. The method according to claim 44, wherein converting the input signal comprises inverting a spectrum of the input signal when the input signal is in one of the first and second sub-bands, and refraining from inverting the input signal when the input signal is in the other of the first and second sub-bands.

* * * * *